(12) United States Patent
Bedeschi et al.

(10) Patent No.: US 7,149,132 B2
(45) Date of Patent: Dec. 12, 2006

(54) BIASING CIRCUIT FOR USE IN A NON-VOLATILE MEMORY DEVICE

(75) Inventors: Ferdinando Bedeschi, Biassono (IT); Claudio Resta, Villa di Tirano (IT)

(73) Assignee: Ovonyx, Inc., Rochester Hills, MI (US)

( * ) Notice: Subject to any disclaimer, the term of this patent is extended or adjusted under 35 U.S.C. 154(b) by 118 days.

(21) Appl. No.: 10/948,885

(22) Filed: Sep. 24, 2004

(65) Prior Publication Data

US 2006/0067154 A1   Mar. 30, 2006

(51) Int. Cl.
*G11C 16/30* (2006.01)

(52) U.S. Cl. .............................. 365/189.11; 365/185.23

(58) Field of Classification Search ............ 365/189.11
See application file for complete search history.

(56) References Cited

U.S. PATENT DOCUMENTS

| | | | | |
|---|---|---|---|---|
| 5,075,890 A | * | 12/1991 | Itoh et al. ............... | 365/185.17 |
| 5,077,691 A | * | 12/1991 | Haddad et al. .......... | 365/185.23 |
| 5,267,209 A | * | 11/1993 | Yoshida ................... | 365/185.27 |
| 5,303,190 A | * | 4/1994 | Pelley, III .............. | 365/189.11 |
| 5,406,524 A | * | 4/1995 | Kawamura et al. .... | 365/185.27 |
| 5,414,669 A | * | 5/1995 | Tedrow et al. .......... | 365/226 |
| 5,483,486 A | * | 1/1996 | Javanifard et al. ..... | 365/185.17 |
| 5,602,794 A | * | 2/1997 | Javanifard et al. ..... | 365/226 |
| 5,608,677 A | * | 3/1997 | Yoon et al. ............. | 365/189.09 |
| 5,657,271 A | * | 8/1997 | Mori ....................... | 365/185.27 |
| 5,740,109 A | * | 4/1998 | Morton et al. .......... | 365/185.18 |
| 5,781,477 A | * | 7/1998 | Rinerson et al. ....... | 365/185.29 |
| 5,825,046 A | | 10/1998 | Czubatyj et al. ........ | 257/2 |
| 5,881,000 A | * | 3/1999 | Maeda .................... | 365/189.09 |
| 5,991,221 A | * | 11/1999 | Ishikawa et al. ......... | 365/226 |
| 5,999,475 A | * | 12/1999 | Futatsuya et al. ........ | 365/226 |
| 6,128,231 A | * | 10/2000 | Chung .................... | 365/185.23 |
| 6,128,242 A | * | 10/2000 | Banba et al. ............. | 365/226 |
| 6,144,589 A | * | 11/2000 | Micheloni et al. ...... | 365/189.11 |
| 6,166,961 A | * | 12/2000 | Lee et al. ............... | 365/185.29 |
| 6,266,276 B1 | * | 7/2001 | Odani .................... | 365/185.18 |
| 6,344,995 B1 | * | 2/2002 | Chen et al. ............. | 365/185.18 |
| 6,456,541 B1 | * | 9/2002 | Tanzawa ................. | 365/189.11 |
| 6,459,643 B1 | * | 10/2002 | Kondo et al. ........... | 365/226 |
| 6,518,830 B1 | * | 2/2003 | Gariboldi et al. ....... | 327/536 |
| 6,535,425 B1 | * | 3/2003 | Nawaki et al. ......... | 365/185.18 |
| 6,535,435 B1 | * | 3/2003 | Tanaka et al. .......... | 365/189.09 |

FOREIGN PATENT DOCUMENTS

GB       1 296 712       11/1972
WO      WO 01/45108 A1    6/2001

* cited by examiner

*Primary Examiner*—Tan T. Nguyen
(74) *Attorney, Agent, or Firm*—Trop, Pruner & Hu, P.C.

(57) ABSTRACT

A biasing circuit for use in a non-volatile memory device is coupled to the row decoder and to the column decoder to supply a first and at least a second biasing voltage for the word and bit lines, and includes a first voltage booster having a first input coupled to receive a supply voltage, a second input coupled to receive a reference voltage, and an output coupled to one of the row decoder and the column decoder to supply the first biasing voltage. A second voltage booster has a first input coupled to receive the supply voltage, a second input coupled to the output of the first voltage booster to receive the first biasing voltage, and an output coupled to the other of the row decoder and the column decoder to supply the second biasing voltage.

10 Claims, 2 Drawing Sheets

BIASING CIRCUIT FOR USE IN A NON-VOLATILE MEMORY DEVICE

BACKGROUND

The present invention relates in general to non-volatile memory devices, including phase change memories.

A phase change memory (PCM) device, also known as Ovonics Unified Memory (OUM) device, is a memory device exploiting memory cells based on a class of materials which have the property of changing between two phases, namely from an amorphous, disorderly phase to a crystalline or polycrystalline, orderly phase, which have distinct electrical characteristics, namely considerably different values of resistivity.

A non-volatile memory device includes a memory array formed by a number of memory cells arranged in rows and columns; word lines connecting first terminals of memory cells arranged in the same row; and bit lines connecting second terminals of memory cells arranged in the same column.

Individual rows of the memory array are addressed by a row decoder which receives an encoded address and biases the word line of the row being addressed at a stable and precise voltage, the value thereof depending upon the operation to be performed (read, write, verify, erase), while individual columns of the memory array are addressed by a column decoder which receives the encoded address and biases the bit line of the column being addressed at a stable and precise voltage, the value thereof depending upon the operation to be performed (read, write, verify, erase).

Non-volatile memory devices are typically of a so-called single supply voltage type. Namely, they receive a single external supply voltage. Voltages having higher values than the external supply voltage, required in the various operations performed on the memory cells (read, program, verify, erase), are supplied externally as additional voltages to the chip or generated inside the non-volatile memory device by one or more voltage elevator circuits, generally known as "voltage boosters" or, more commonly, "charge pumps."

A charge pump is generally formed by a plurality of booster stages cascaded between the input and the output of the charge pump and each formed by a boost capacitor with a high capacitance and by a switch which is closed or opened alternately with the adjacent switch and is made by means of diodes (for example ones made using MOS transistors having gate and drain terminals connected together), or else by means of MOS transistors.

Transfer of charge from one booster stage to the next, towards the output is upon command of complementary phase signals, either overlapping or non-overlapping, supplied to the booster stages and generated by a phase-generator circuit, e.g., a ring oscillator, supplying a clock signal having a pre-set frequency and preferably of a non-overlapping-signal generator receiving the clock signal and supplying a first logic phase signal and a second logic phase signal, both supplied to the booster stages.

The boosted voltages supplied by charge pumps are, however, generally far from stable, and consequently are regulated and stabilized by voltage regulators each arranged downstream of a respective charge pump, preferably by reducing the frequency or halting oscillation once adequate pump voltage is achieved.

Non-volatile memories may have increased power consumption due to leakage by non-addressed cells.

Thus, there is a need for alternate memory designs.

DETAILED DESCRIPTION

Figure 1:
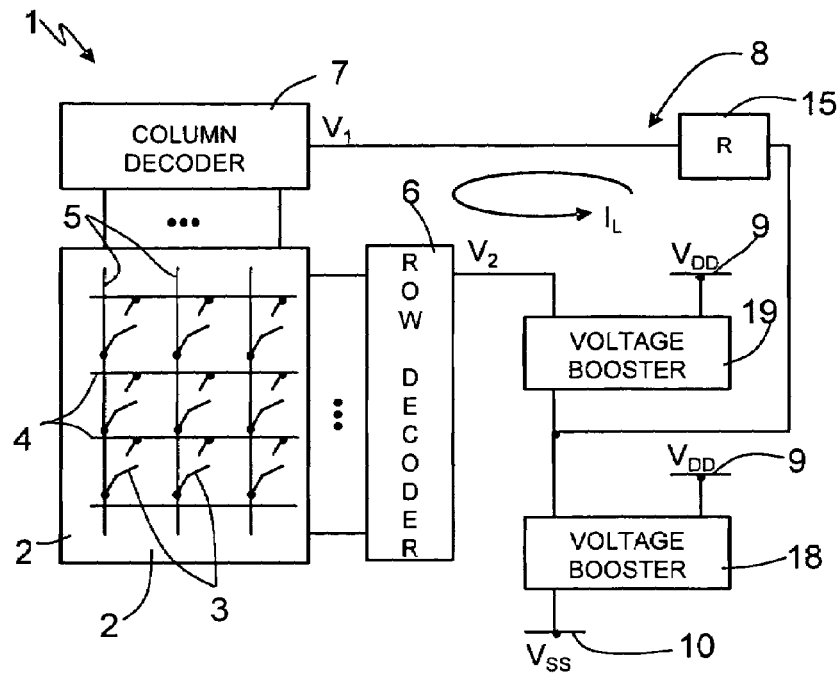
FIG. 1 shows a circuit diagram of a biasing circuit according to one embodiment of the present invention.

FIG. 1 shows a non-volatile memory device 1 including a memory array 2 formed by memory cells 3 arranged in rows and columns. The word lines 4 connect first terminals of the memory cells 3 arranged in the same row. The bit lines 5 connect second terminals of the memory cells 3 arranged in the same column. A row decoder 6 connects to the memory array 2 to bias the word lines 4. A column decoder 7 connects to the memory array 2 to bias the bit lines 5. A biasing circuit 8 connects to the row decoder 6 and the column decoder 7 to supply biasing voltages for the word and bit lines 4, 5.

The biasing circuit 8 comprises a supply line 9 set at the supply voltage $V_{DD}$ supplied from outside to the non-volatile memory device 1; and a reference line 10 set at the reference voltage $V_{SS}$ which may be either the ground voltage or any other positive or negative voltage with respect to which any other voltage in the memory device 1 is referred.

The first and second biasing voltages $V_1$ and $V_2$ are generated by means of two cascaded voltage boosters 18, 19. The first voltage booster 18 has a supply input connected to the supply line 9 to receive the supply voltage $V_{DD}$, a reference input connected to the reference line 10 to receive the reference voltage $V_{SS}$, and an output connected to the column decoder 7. The booster 18 supplies the first biasing voltage $V_1$. The second voltage booster 19 has a supply input connected to the supply line 9 to receive the supply voltage $V_{DD}$, a reference input connected to the output of the first voltage booster 18 to receive the first biasing voltage $V_1$, and an output connected to the row decoder 6. The booster 19 supplies the second biasing voltage $V_2$.

The writing voltage $V_W = V_{PUMP}$ may be generated by cascading a third voltage booster (not shown) having a supply input connected to the supply line 9 to receive the supply voltage $V_{DD}$, a reference input connected to the output of the second voltage booster 19 to receive the second biasing voltage $V_2 = 2 \cdot V_{PUMP}/3$, and an output supplying the writing voltage $V_W = V_{PUMP}$. An another example, the writing voltage may be generated by means of three further cascaded voltage boosters.

Voltage boosters 18 and 19 have reference inputs which are not both connected to the same reference line 10 and thus, they are not biased at the same reference voltage. The reference input of the first voltage booster 18 is connected to the reference line 10 and thus is biased at the reference voltage $V_{SS}$, whereas the input of the second voltage booster 19 is connected to the output of the first voltage booster 18 biased at the first biasing voltage $V_1 = V_W/3$. This connection causes the cumulative leakage current $I_L$ to flow in a closed loop including the equivalent resistor 15 and the second booster stage 19 only.

In this way, the cumulative leakage current $I_L$ does not flow thorough the first voltage booster 18 and its power consumption is, therefore, reduced, if not eliminated. The first voltage booster 18 is therefore only used to bias intermediate node A between the two voltage boosters 18 and 19 at the first biasing voltage $V_1 = V_W/3$.

Power consumption due to the non-addressed memory cells is:

$$W=(V_2-V_1)\cdot I_L=W_{ARRAY}$$

Each voltage booster 18, 19 may be implemented in different ways. For example, the boosters 18, 19 may be implemented by means of a self-regulating voltage booster, shown in FIG. 2, without, therefore, the need for a separate voltage regulator. The self-regulating voltage booster includes a phase generator 21 having a clock input receiving a clock signal, an enable input receiving an enabling signal ENABLE, and an output supplying a phase signal PH. A charge pump 22 has a supply input connected to the supply line 9 to receive the supply voltage $V_{DD}$. The pump 22 also includes a reference input. The reference input for the first voltage booster 18 is connected to the reference line 10 to receive the reference voltage $V_{SS}$. The reference input for the second voltage booster 19 is connected to the output of the first voltage booster 18 to receive the first biasing voltage $V_1=V_W/3$, a phase input connected to the output of the phase generator 21 to receive the phase signal PH, and an output supplying a boosted voltage $V_{PUMP}$ which is the first biasing voltage $V_1=V_W/3$ in the first voltage booster 18, and the second biasing voltage $V_2=2\cdot V_W/3$ in the second voltage booster 19. A filtering capacitor 23 is connected between the output of the charge pump 22. In the first voltage booster 18 the capacitor 23 is coupled to the reference line 10 to receive the reference voltage $V_{SS}$. In the second voltage booster 19, the capacitor 23 is coupled to the output of the first voltage booster 18 to receive the first biasing voltage $V_1=V_W/3$. A regulating stage 24 senses the boosted voltage $V_{PUMP}$ supplied by the charge pump 22 and switches the phase generator 21 (and consequently the charge pump 22) off and on to maintain the boosted voltage $V_{PUMP}$ at a desired value.

A further filtering capacitor (not shown) may be connected between the output of the second voltage booster 19 and the reference line 10.

In particular, the regulating stage 24 switches the phase generator 21 off when the boosted voltage $V_{PUMP}$ reaches the desired value, and switches the phase generator 21 on when the boosted voltage $V_{PUMP}$ drops below the desired value.

The regulating stage 24 includes a resistor 25 and a current generator 26 connected in series between the output of the charge pump 22 and the reference line 10 and defining an intermediate node 27 having a voltage correlated to the boosted voltage $V_{PUMP}$. A comparator 28 has a supply input connected to the supply line 9 to receive the supply voltage $V_{DD}$, a reference input connected to the reference line 10 to receive the reference voltage $V_{SS}$, a sensing input connected to the intermediate node 27 to sense the boosted voltage $V_{PUMP}$, a threshold input receiving a threshold voltage $V_{TH}$ representing the desired value for the boosted voltage $V_{PUMP}$, and an output connected to the enable input of the phase generator 21 to supply the enabling signal ENABLE.

The enabling signal ENABLE has a high logic level when the voltage on the intermediate node 27 is higher than the threshold voltage $V_{TH}$ and a low logic level when the voltage on the intermediate node 27 is lower than the threshold voltage $V_{TH}$.

Switching off and on of the charge pump 22 may enable the generation of a stable, finely regulated boosted voltage $V_{OUT1}$, in some embodiments. The feedback circuit composed of resistor 25 and current source 26 may also be implemented as a bandbap circuit to reduce variation in variables such as temperature and supply voltage by techniques familiar to those skilled in the art.

Figure 2:
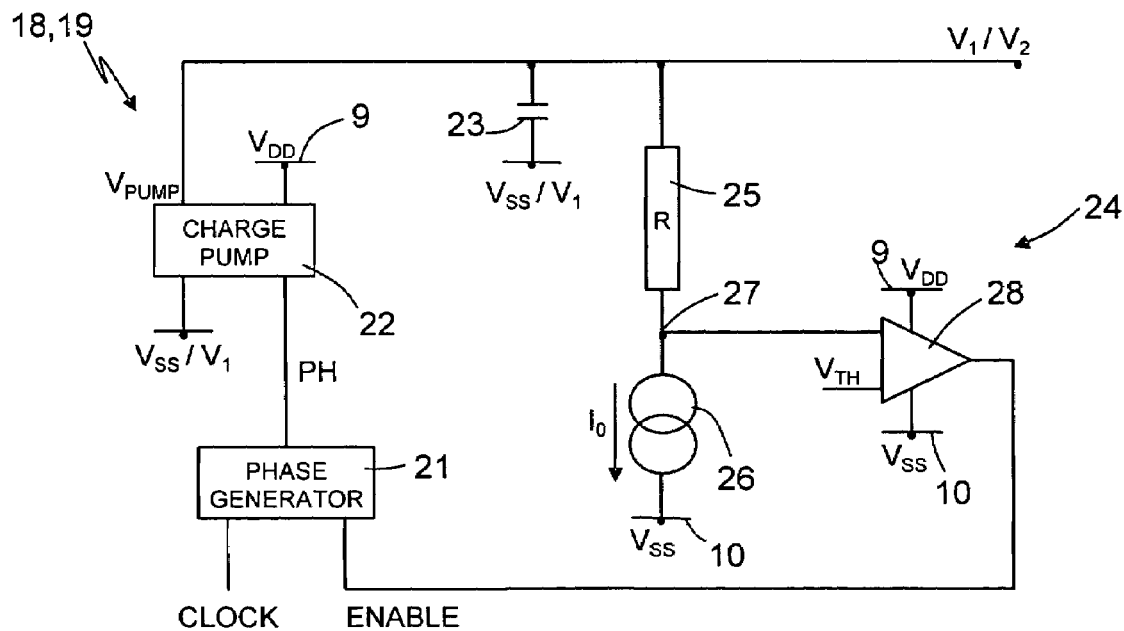
FIG. 2 shows a circuit diagram of a self-regulating voltage booster according to one embodiment of the present invention.

The circuit diagram shown in FIG. 2 may also be used to generate the writing voltage $V_W=V_{PUMP}$. The reference input of the charge pump 22 is connected to output of the second voltage booster 19 to receive the second biasing voltage $V_1=2\cdot V_W/3$. The charge pump 22 supplies a boosted voltage $V_{PUMP}$ equal to the writing voltage $V_W=V_{PUMP}$.

Figure 3:
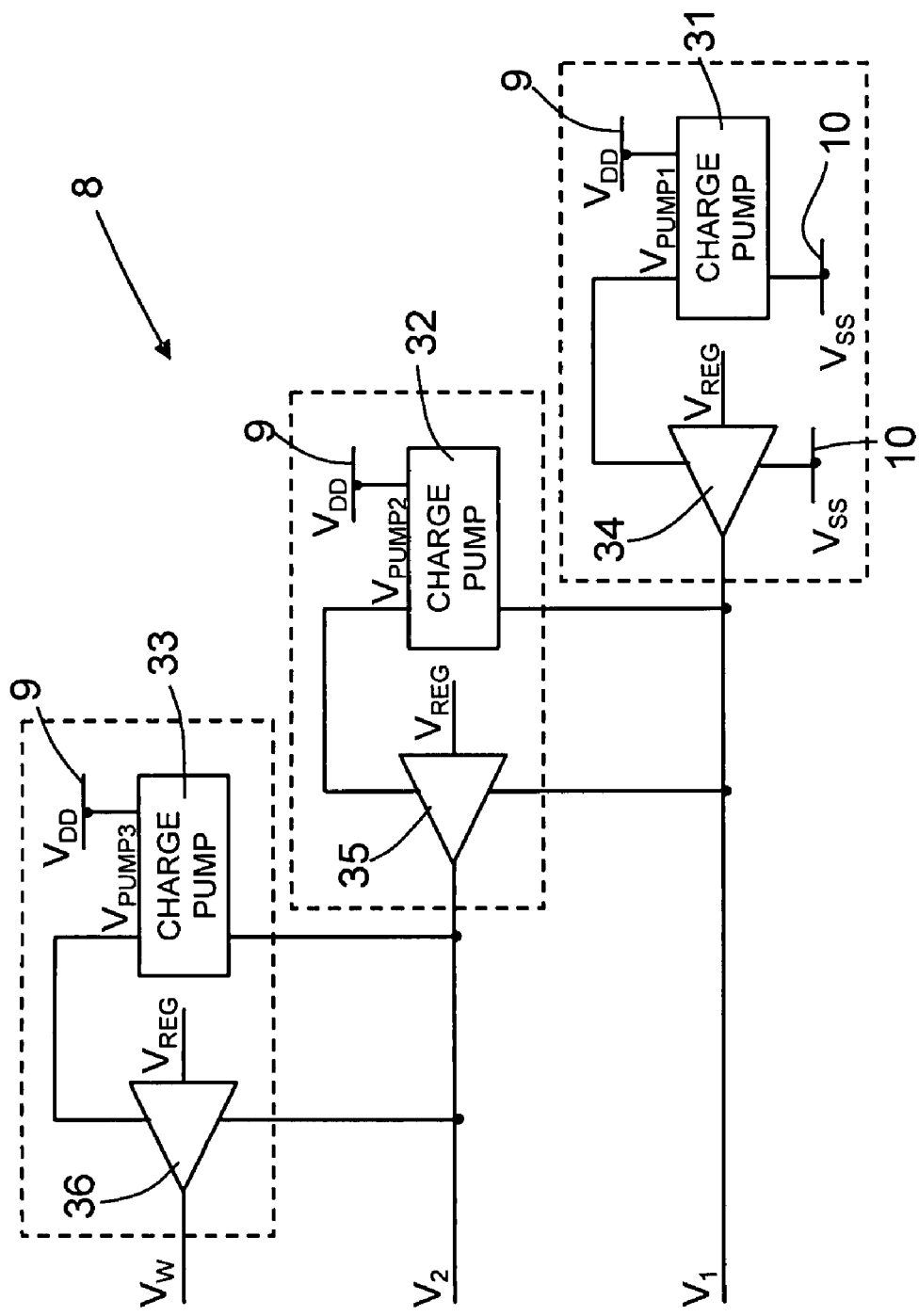
FIG. 3 shows a biasing circuit according to another embodiment of the present invention.

In FIG. 3, a biasing circuit may be implemented by means of traditional charge pumps and separate voltage regulators. A similar circuit diagram may be used to generate the reading voltage $V_R$ and the regulated voltages $V_R/2$ used during reading of a PCM cell.

As shown in FIG. 3, the biasing circuit 8 includes three charge pumps 31, 32 and 33 and three voltage regulators 34, 35 and 36, each coupled to the output of a respective charge pump 31, 32, 33.

The first charge pump 31 has a supply input connected to the supply line 9 to receive the supply voltage $V_{DD}$, a reference input connected to the reference line 10 to receive the reference voltage $V_{SS}$, and an output supplying a first boosted voltage $V_{PUMP1}$ cabable of being higher than the supply voltage $V_{DD}$. The first voltage regulator 34 has a supply input connected to the output of the first charge pump 31 to receive the first boosted voltage $V_{PUMP1}$, a reference input connected to the reference line 10 to receive the reference voltage $V_{SS}$, a regulation input receiving a regulation voltage $V_{REG}$ necessary to carry out the regulation function and supplied, for example, by a band-gap voltage generator, and an output connected to the column decoder 7 to supply the first biasing voltage $V_1=V_W/3$ for the non-addressed bit lines 5.

The second charge pump 32 has a supply input connected to the supply line 9 to receive the supply voltage $V_{DD}$, a reference input connected to the output of the first voltage regulator 34 to receive the first biasing voltage $V_1=V_W/3$, and an output supplying a second boosted voltage $V_{PUMP2}$ higher than the first biasing voltage $V_1=V_W/3$. The second voltage regulator 35 has a supply input connected to the output of the second charge pump 32 to receive the second boosted voltage $V_{PUMP2}$, a reference input connected to the output of the first voltage regulator 34 to receive the first biasing voltage $V_1=V_W/3$, a regulation input receiving the regulation voltage $V_{REG}$, and an output connected to the row decoder 6 to supply the second biasing voltage $V_2=2\cdot V_W/3$ for the non-addressed word lines 4.

Lastly, the third charge pump 33 has a supply input connected to the supply line 9 to receive the supply voltage $V_{DD}$, a reference input connected to the output of the second voltage regulator 35 to receive the second biasing voltage $V_2=2\cdot V_W/3$, and an output supplying a third boosted voltage $V_{PUMP3}$ higher than the second biasing voltage $V_2=2\cdot V_W/3$. The third voltage regulator 36 has a supply input connected to the output of the third charge pump 33 to receive the third boosted voltage $V_{PUMP3}$, a reference input connected to the output of the second voltage regulator 35 to receive the second biasing voltage $V_2=2\cdot V_W/3$, a regulation input receiving the regulation voltage $V_{REG}$, and an output connected to the column decoder 7 and supplying the writing voltage $V_3=V_W$ for the addressed bit line 5.

A significant reduction in the power consumption due to the leakage current flowing in the non-addressed memory cells may be achieved in some embodiments. Further, in some embodiments, the pumps can generate more than one voltage more efficiently than if three separate independent pumps are utilized.

The biasing voltages applied to the bit and word lines 4, 5 during writing may have different values than those indicated above, and since a PCM cell 3 is a symmetrical memory element which can draw current bi-directionally, the biasing voltages applied to the bit and word lines 4, 5 may be reversed with respect to what has been described above. In particular, during writing the addressed bit line 5 may be biased at the reference voltage $V_{SS}$ and the addressed word lines 4 may be biased at the writing voltage $V_W$, whereas all the non-addressed word lines may be biased at the first biasing voltage $V_1=V_H/3$ and all the non-addressed bit lines may be biased at the second biasing voltage $V_2=2\cdot V_H/3$.

Moreover, the charge pumps and voltage boosters described above may up-pump or down-pump, i.e., they may supply a boosted voltage which may have either the same sign as and an absolute value higher than the input voltage (up-pumping), or a sign opposite to and an absolute value higher than the input voltage (down-pumping).

The biasing circuit may be used not only to generate biasing voltages necessary during writing, but also to generate biasing voltages necessary during all the other operations to be performed on the memory cells (read, verify, erase).

The biasing circuit may be used not only in PCM devices, but in any other type of non-volatile memory device.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A non-volatile memory comprising:
   a supply voltage;
   a first boosting circuit to generate a first boosted biasing voltage higher than the absolute value of said supply voltage; and
   a second boosting circuit to generate a second boosted biasing voltage having an absolute value higher than the first boosted biasing voltage, said second boosting circuit coupled to the first boosting circuit to receive said first boosted biasing voltage, wherein the first and second boosting circuits include a charge pump and a voltage regulator coupled to the output of the charge pump.

2. A non-volatile memory as claimed in claim 1, wherein said first boosting circuit includes:
   a charge pump having a first input to receive the supply voltage and a second input configured to receive a reference voltage, and an output being configured to supply the first boosted biasing voltage.

3. A non-volatile memory as claimed in claim 1 wherein said second boosting circuit includes a second input configured to the output of the first boosting circuit to receive the first boosted biasing voltage and the output being configured to supply the second boosted biasing voltage; and
   a regulating stage having a sensing input coupled to the output of the charge pump to sense the output voltage thereof, a reference input to receive a threshold voltage indicative of a desired value for the output voltage of the charge pump, and an output to switch off and on the charge pump to regulate the output voltage thereof at the desired value.

4. A non-volatile memory as claimed in claim 1, wherein the charge pump has a first input to receive the supply voltage, a reference input, and an output to supply a first boosted biasing voltage, a second input being configured to receive a reference voltage, and the output being configured to supply the first biasing voltage.

5. A non-volatile memory as claimed in claim 1, wherein the charge pump has a first input to receive the supply voltage, a reference input, and an output to supply a second boosted biasing voltage, the second input being coupled to the output of the first boosting means to receive the first biasing voltage, and wherein each voltage regulator has a first input coupled to the output of the corresponding charge pump to receive the boosted voltage supplied thereby, a second input, and an output, the second input being coupled to the output of the first boosting means to receive the first biasing voltage, and the output being configured to supply the second biasing voltage.

6. A non-volatile memory device comprising:
   an array of cells;
   a first boosting circuit having a first input to receive a supply voltage, a second input to receive a reference voltage, and an output to supply a first biasing voltage; and
   a second boosting circuit having a first input to receive the supply voltage, a second input coupled to the output of the first boosting circuit to receive the first biasing voltage, and an output to supply the second biasing voltage, wherein the first and second boosting circuits include a charge pump and a voltage regulator coupled to the output of the charge pump.

7. A non-volatile memory device as claimed in claim 6, wherein the first and second boosting circuits include a self-regulating voltage booster.

8. A non-volatile memory device as claimed in claim 7, wherein a self-regulating voltage booster includes:
   a charge pump having a first input to receive the supply voltage, a second input, and an output; in the first boosting means the second input being configured to receive the reference voltage, and the output being configured to supply the first biasing voltage, and in the second boosting means the second input being configured to the output of the first boosting means to receive the first biasing voltage, and the output being configured to supply the second biasing voltage; and
   a regulating stage having a sensing input coupled to the output of the charge pump to sense the output voltage thereof, a reference input to receive a threshold voltage indicative of a desired value for the output voltage of the charge pump, and an output to switch off and on the charge pump to regulate the output voltage thereof at the desired value.

9. A non-volatile memory device as claimed in claim 6, wherein each charge pump has a first input to receive the supply voltage, a reference input, and an output to supply a boosted voltage; in the first boosting means the second input being configured to receive the reference voltage, and in the second boosting means the second input being coupled to the output of the first boosting means to receive the first biasing voltage; and wherein each voltage regulator has a first input coupled to the output of the corresponding charge pump to receive the boosted voltage supplied thereby, a second input, and an output; in the first boosting means the second input being configured to receive the reference voltage, and the output being configured to supply the first biasing voltage, and in the second boosting means the second input being coupled to the output of the first boosting means to receive the first biasing voltage, and the output being configured to supply the second biasing voltage.

10. A method comprising:
    providing a first boosting circuit having a charge pump, a voltage regulator, a first input to receive a supply voltage, a second input to receive a reference voltage, and an output to supply a first biasing voltage; and
    providing a second boosting circuit having a charge pump, a voltage regulator, a first input to receive a supply voltage, a second input coupled to the output of the first boosting circuit to receive a first biasing voltage, and an output to supply a second biasing voltage.

* * * * *